(12) United States Patent
Donadel et al.

(10) Patent No.: US 12,209,864 B2
(45) Date of Patent: Jan. 28, 2025

(54) DRIVING CIRCUIT FOR CONTROLLING A MEMS OSCILLATOR OF RESONANT TYPE

(71) Applicant: STMicroelectronics S.r.l., Agrate Brianza (IT)

(72) Inventors: Andrea Donadel, Meda (IT); Emanuele Lavelli, Mandello del Lario (IT); Stefano Polesel, Treviso (IT)

(73) Assignee: STMicroelectronics S.r.l., Agrate Brianza (IT)

(\*) Notice: Subject to any disclaimer, the term of this patent is extended or adjusted under 35 U.S.C. 154(b) by 399 days.

(21) Appl. No.: 17/847,003

(22) Filed: Jun. 22, 2022

(65) Prior Publication Data

US 2022/0412739 A1 Dec. 29, 2022

(30) Foreign Application Priority Data

Jun. 28, 2021 (IT) .................. 102021000016877

(51) Int. Cl.
*G01C 19/5726* (2012.01)
*G01C 19/5755* (2012.01)
*H03M 3/00* (2006.01)

(52) U.S. Cl.
CPC ..... *G01C 19/5726* (2013.01); *G01C 19/5755* (2013.01); *H03M 3/464* (2013.01)

(58) Field of Classification Search
CPC ............ G01C 19/5726; G01C 19/5755; G01C 19/5776; H03M 3/464; H03M 3/50;
(Continued)

(56) References Cited

U.S. PATENT DOCUMENTS 9,097,525 B2 \* 8/2015 Cazzaniga ......... G01C 19/5776
10,488,200 B2 \* 11/2019 Gattere ................ G01C 19/574
(Continued)

FOREIGN PATENT DOCUMENTS

EP 3460397 A1 3/2019

OTHER PUBLICATIONS

Northemann et al., "A digital interface for gyroscopes controlling the primary and secondary mode using bandpass sigma-delta modulation," *Sensors and Actuators A Physical* 162:388-393, 2010.
(Continued)

*Primary Examiner* — Francis C Gray
(74) *Attorney, Agent, or Firm* — Seed IP Law Group LLP (57) ABSTRACT

A driving circuit for controlling a MEMS oscillator includes a digital conversion stage to acquire a differential sensing signal indicative of a displacement of a movable mass of the MEMS oscillator, and to convert the differential sensing signal of analog type into a digital differential signal of digital type. Processing circuitry is configured to generate a digital control signal of digital type as a function of the comparison between the digital differential signal and a differential reference signal indicative of a target amplitude of oscillation of the movable mass which causes the resonance of the MEMS oscillator. An analog conversion stage includes a ΣΔ DAC and is configured to convert the digital control signal into a PDM control signal of analog type. A filtering stage of low-pass type, by filtering the PDM control signal, generates a control signal for controlling the amplitude of oscillation of the movable mass.

20 Claims, 4 Drawing Sheets

(58) Field of Classification Search
CPC .. H03K 7/08; B81B 2201/0242; B81B 7/008; H03H 9/02244; H03L 7/08
See application file for complete search history.

(56) References Cited

U.S. PATENT DOCUMENTS

| | | | |
|---|---|---|---|
| 10,648,813 B2* | 5/2020 | Mecchia | G01C 19/5776 |
| 11,841,229 B2* | 12/2023 | Facchinetti | G01C 19/5776 |
| 2011/0197675 A1* | 8/2011 | Caminada | G01C 19/5726 73/504.12 |
| 2013/0118256 A1 | 5/2013 | Prandi et al. | |
| 2014/0260609 A1* | 9/2014 | Garbarino | G01C 19/5726 73/504.12 |
| 2017/0328712 A1* | 11/2017 | Collin | H03M 3/458 |
| 2019/0078889 A1 | 3/2019 | Facchinetti | |
| 2020/0408523 A1 | 12/2020 | Fang et al. | |

OTHER PUBLICATIONS

Northemann et al., "Drive and Sense Interface for Gyroscopes based on Bandpass Sigma-Delta Modulators," IEEE 3264-3267, 2010.

* cited by examiner

DRIVING CIRCUIT FOR CONTROLLING A MEMS OSCILLATOR OF RESONANT TYPE

BACKGROUND

Technical Field

The present disclosure relates to a driving circuit for controlling a MEMS oscillator of resonant type. In particular, it relates to a driving circuit comprising an analog conversion stage including a digital-to-analog converter (DAC) of ΣΔ type, to a MEMS oscillator (in particular, a MEMS gyroscope) comprising the driving circuit, to an apparatus comprising the MEMS oscillator, and to a method for controlling the MEMS oscillator.

Description of the Related Art

As known, MEMS ("Micro Electro-Mechanical Systems")-type gyroscopes are devices of resonant type. Consequently, the use of gyroscopes requires controlling the primary resonator thereof in order to ensure its correct oscillation. This generally occurs through closed-loop electronic controls, which sense the displacements of oscillating seismic masses of the gyroscopes and, as a function of these sensed displacements, control the seismic masses in such a way that they ensure that the oscillation persists with the desired amplitude. In particular, the oscillation is maintained by respecting the well-known Barkhausen conditions which establish that the closed loop at the resonance frequency needs to or should have unitary gain and needs to or should have an overall phase shift equal to 2n.

Known solutions allow to control a gyroscope in closed loop through a purely analog type control. In particular, this analog control is implemented through an analog driving circuit which generally comprises a capacitance-to-voltage (C2V) converter which senses the displacements of the seismic mass of the gyroscope by capacitive effect and generates a corresponding sensing signal indicative of such displacements. A phase-locked loop (PLL) is used to receive the sensing signal and to calculate a clock signal of the oscillation, in order to use that clock signal to command the seismic mass so as to impose the condition on the overall phase shift of the oscillation. Furthermore, an AGC ("Automatic Gain Control") block, in parallel to the PLL, is used to receive the sensing signal and consequently command the amplitude of the oscillation, maintaining it equal to the desired one.

However, it is known that the AGC block extracts, from the sensing signal, the information on the amplitude of the oscillation of the seismic mass at a demodulation frequency $f_{dem}$ which is equal to an oscillation frequency $f_{dr}$ of the seismic mass (generally approximately equal to a natural resonance frequency of the gyroscope). In other words, the AGC block operates a demodulation which is of synchronous type and which exploits a signal with a sinusoidal or square waveform with $f_{dem}=f_{dr}$. Furthermore, this AGC block needs or should have a filtering block of active type to insert the singularities necessary to have a stable feedback loop and to filter the higher harmonics (e.g., at $2f_{dr}$) generated by the demodulation, to prevent them from causing higher and spurious vibrational modes in the oscillation of the seismic mass. The filtering block of active type causes, in its operation, a further power consumption and complicates the structure of the analog driving circuit.

Consequently, the known analog driving circuits cannot be used to control low-power gyroscopes (e.g., operating at powers being lower than approximately 1 mW), due to the high power consumption due to the filtering of the higher harmonics of the signal generated as an output, and to the fact that the AGC block comprises closed-loop amplifiers which have high consumption.

Other known solutions allow the gyroscope in closed loop to be controlled through a control of digital type.

This digital control is implemented through a digital driving circuit that comprises the PLL and the AGC block, both implemented digitally through an FPGA ("Field Programmable Gate Array"). Similarly to what has been previously described, the AGC block extracts, from the sensing signal and the clock signal generated by the PLL, the information on the amplitude of the oscillation of the seismic mass at $f_{dem}=f_{dr}$. Furthermore, a fourth-order ΣΔ-type digital-to-analog converter (DAC) is used to generate, on the basis of the signal generated by the AGC block, a PDM ("Pulse Density Modulation") signal used to directly control the oscillation of the seismic mass.

However, the high analog-to-digital conversion frequency of an ADC block of the AGC block to ensure correct sampling of the sensing signal and the resulting correct functioning of the AGC block and the digital PLL causes high power consumption. Furthermore, the fourth-order ΣΔ DAC increases complexity and cost of the digital control, and the output PDM signal has a high-frequency noise (given by the quantization noise of the ΣΔ DAC) such that it generates, in the oscillation of the seismic mass, higher vibrational modes which are deleterious to the operation of the gyroscope.

BRIEF SUMMARY

In various embodiments, the present disclosure provides a driving circuit, a MEMS oscillator, an apparatus and a method for controlling the MEMS oscillator that overcome the drawbacks of the prior art.

In at least one embodiment, a driving circuit for controlling a MEMS oscillator is provided that includes a digital conversion stage configured to acquire a differential sensing signal indicative of a sensed displacement of a movable mass of the MEMS oscillator, and to convert the differential sensing signal of analog type into a digital differential signal of digital type. Processing circuitry is electrically coupled to the digital conversion stage and configured to generate a digital control signal of digital type as a function of the comparison between the digital differential signal and a differential reference signal indicative of a target amplitude of oscillation of the movable mass which causes, at the resonance frequency of the MEMS oscillator, the resonance of the MEMS oscillator. An analog conversion stage is electrically coupled to the processing circuitry and configured to convert the digital control signal into a PDM control signal of analog type, the analog conversion stage including a digital-to-analog converter (DAC) of ΣΔ type. A filtering stage of low-pass type is electrically coupled to the analog conversion stage and configured to, by filtering the PDM control signal, generate a control signal for controlling the amplitude of oscillation of the movable mass.

In at least one embodiment, a MEMS oscillator is provided that includes a substrate, a movable mass, and a driving circuit integrated in the substrate. The movable mass is elastically coupled to the substrate and controllable through the control signal to oscillate in resonance with respect to the substrate.

In at least one embodiment, a method of controlling a MEMS oscillator is provided that includes: acquiring, through a digital conversion stage, a differential sensing signal indicative of a sensed displacement of a movable mass of the MEMS oscillator; converting, through a digital conversion stage, the differential sensing signal of analog type into a digital differential signal of digital type; generating, through processing circuitry electrically coupled to the digital conversion stage, a digital control signal of digital type as a function of the comparison between the digital differential signal and a differential reference signal indicative of a target amplitude of oscillation of the movable mass which causes, at the resonance frequency of the MEMS oscillator, the resonance of the MEMS oscillator; converting, through an analog conversion stage electrically coupled to the processing circuitry, the digital control signal into a PDM control signal of analog type, the analog conversion stage including a digital-to-analog converter (DAC) of ΣΔ type; generating, through a filtering stage of low-pass type electrically coupled to the analog conversion stage, a control signal by filtering the PDM control signal; and controlling the amplitude of oscillation of the movable mass through the control signal.

BRIEF DESCRIPTION OF THE SEVERAL VIEWS OF THE DRAWINGS

For a better understanding of the present disclosure, a preferred embodiment is now described, purely by way of non-limiting example, with reference to the attached drawings, wherein.

Elements common to the different embodiments of the present disclosure, described below, are indicated with the same reference numbers.

DETAILED DESCRIPTION

Figure 1:
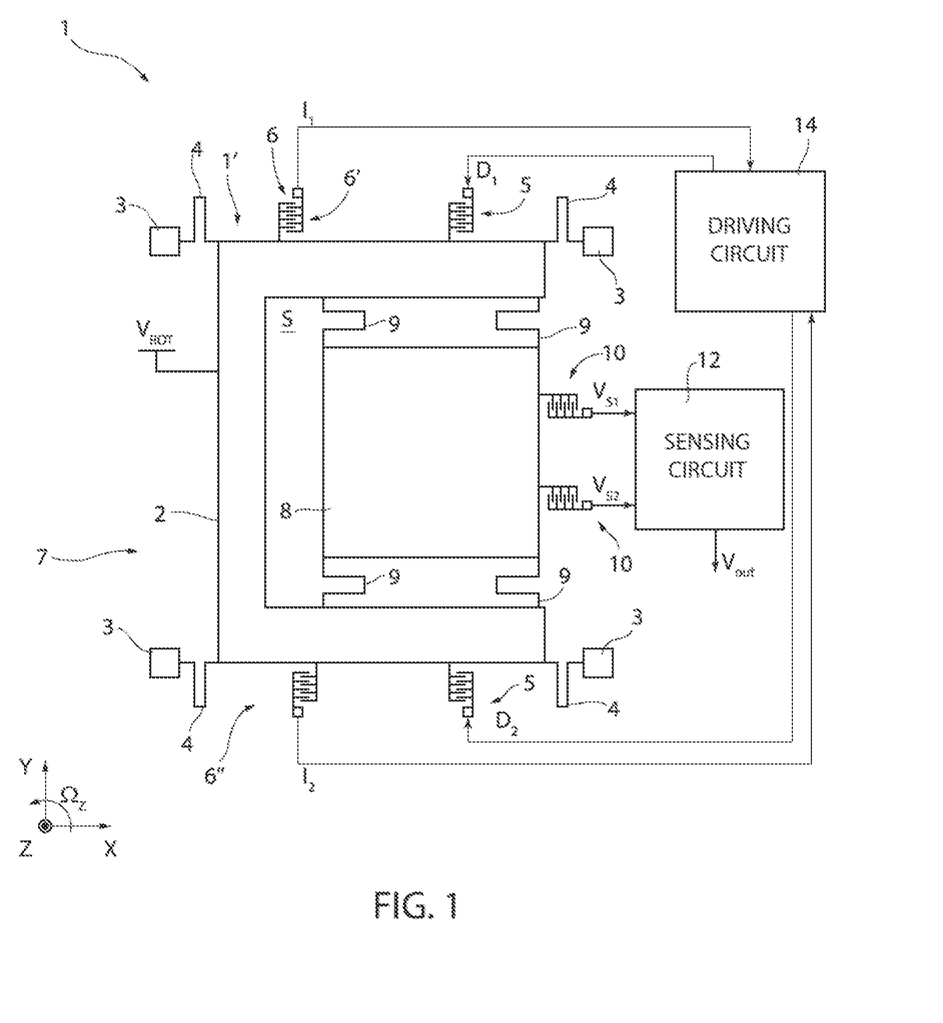
FIG. 1 shows a simplified and schematic representation of a MEMS oscillator, in particular of a gyroscope.

FIG. 1 schematically shows, in a Cartesian (triaxial) reference system of axes X, Y, Z, a MEMS device 1 of resonant type, in particular a second-order MEMS resonator (or oscillator).

In greater detail, FIG. 1 shows, purely by way of example, a possible embodiment of a known type of a MEMS gyroscope 1; in this case, the gyroscope 1 is exemplarily of uniaxial type, that is, it is able to sense an angular speed, for example an angular speed $\Omega_z$, acting along a single sensing axis, in the example acting around the Z-axis.

The MEMS gyroscope 1 comprises a micromechanical structure having a seismic driving mass 2, with main extension in an XY-plane defined by the X- and Y-axes. The seismic mass 2 is coupled to a substrate S through anchors 3, whereto it is connected by elastic anchoring elements 4, which are configured to allow a displacement movement of the seismic mass 2 along the X-axis.

Driving electrodes 5 and first sensing electrodes 6 are coupled to the seismic mass 2 and comprise respective movable electrodes, integral with the seismic mass 2, and respective fixed electrodes, fixed with respect to the substrate S. Both for the driving electrodes 5 and for the first sensing electrodes 6, the movable electrodes and the fixed electrodes are capacitively coupled to each other and, in detail, have an interdigitated structure.

In use, the driving electrodes 5 may be biased through driving (or excitation) signals $D_1$ and $D_2$ so as to generate, by effect of the electrostatic coupling between the respective movable electrodes and the respective fixed electrodes, the aforementioned driving movement of the seismic mass 2; in particular, they allow a resonant movement of the seismic mass 2 to be generated at an oscillation frequency $f_{dr}$ which, to have the MEMS gyroscope 1 in resonance, needs to or otherwise should correspond to the natural oscillation frequency of the micromechanical structure 1' (or resonance frequency of the MEMS gyroscope 1). Instead, the first sensing electrodes 6 generate sensing signals $I_1$ and $I_2$, which are in particular capacitance variation signals indicative of the extent of the movement of the seismic mass 2 along the X-axis, that is of the amplitude of oscillation of the seismic mass 2. In detail, the sensing signals $I_1$, $I_2$ are of differential type, that is, they have variations opposite to each other in response to the movement of the seismic mass 2. As illustrated in FIG. 1, a first series of first sensing electrodes, indicated with 6', is in fact configured to generate a first capacitance variation due to the movement of the seismic mass 2, and a second series of first sensing electrodes, indicated with 6", is configured to generate a second capacitance variation, opposite to the first capacitance variation, due to the same movement of the seismic mass 2.

The micromechanical structure 1' of the MEMS gyroscope 1 also comprises an inertial mass 8 which is elastically coupled to the seismic mass 2 by elastic coupling elements 9 configured in such a way that the inertial mass 8 is integral with the seismic mass 2 during the oscillatory motion of the latter along the X-axis, and is also free to move (sensing movement) along the Y-axis as a result of the Coriolis force that is generated in the presence of the angular speed $\Omega_z$ acting around the Z-axis. The seismic mass 2 and the inertial mass 8 form a movable mass 7 of the MEMS gyroscope 1.

Second sensing electrodes 10 are coupled to the inertial mass 8 and comprise respective movable electrodes, integral with the inertial mass 8, and respective fixed electrodes, fixed with respect to the substrate S. The movable electrodes and the fixed electrodes of the second sensing electrodes 10 are capacitively coupled to each other and, in detail, have an interdigitated structure. Consequently, the second sensing electrodes 10 generate differential capacitive variations due to the sensing movement.

In detail, in use, the second sensing electrodes 10 allow the generation of reading signals $V_{s1}$ and $V_{s2}$, in particular capacitive variation signals indicative of the extent of the sensing movement (i.e., of the amplitude of the oscillation of the inertial mass 8 along the Y-axis), which may be suitably processed, in a known manner, to determine the value of the angular speed $\Omega_z$ to be sensed.

Furthermore, the MEMS gyroscope 1 comprises: a sensing, or reading, circuit 12, coupled to the second sensing electrodes 10 and configured to generate an output signal (output voltage $V_{out}$) as a function of the reading signals $V_{s1}$ and $V_{s2}$; and a driving circuit 14 better discussed below, coupled to the driving electrodes 5 and to the first sensing electrodes 6 and configured to generate the driving signals $D_1$ and $D_2$ through a feedback control based on the sensing signals $I_1$ and $I_2$ and on a desired amplitude of oscillation of the seismic mass 2 (the value of this amplitude is determined in a known manner during the design step so as to ensure the desired sensitivity of the MEMS gyroscope 1 in sensing the angular speeds $\Omega_z$). In fact, the amplitude of oscillation of the seismic mass 2 needs to or should otherwise be carefully controlled, since its value affects the sensitivity of the MEMS gyroscope 1 in sensing the angular speeds $\Omega_z$.

Furthermore, the seismic mass 2 and the inertial mass 8 are biased in use at a constant voltage, indicated with $V_{ROT}$ in FIG. 1 and in the subsequent Figures.

In greater detail, the driving circuit 14 is integrated in the MEMS gyroscope 1.

Figure 2:
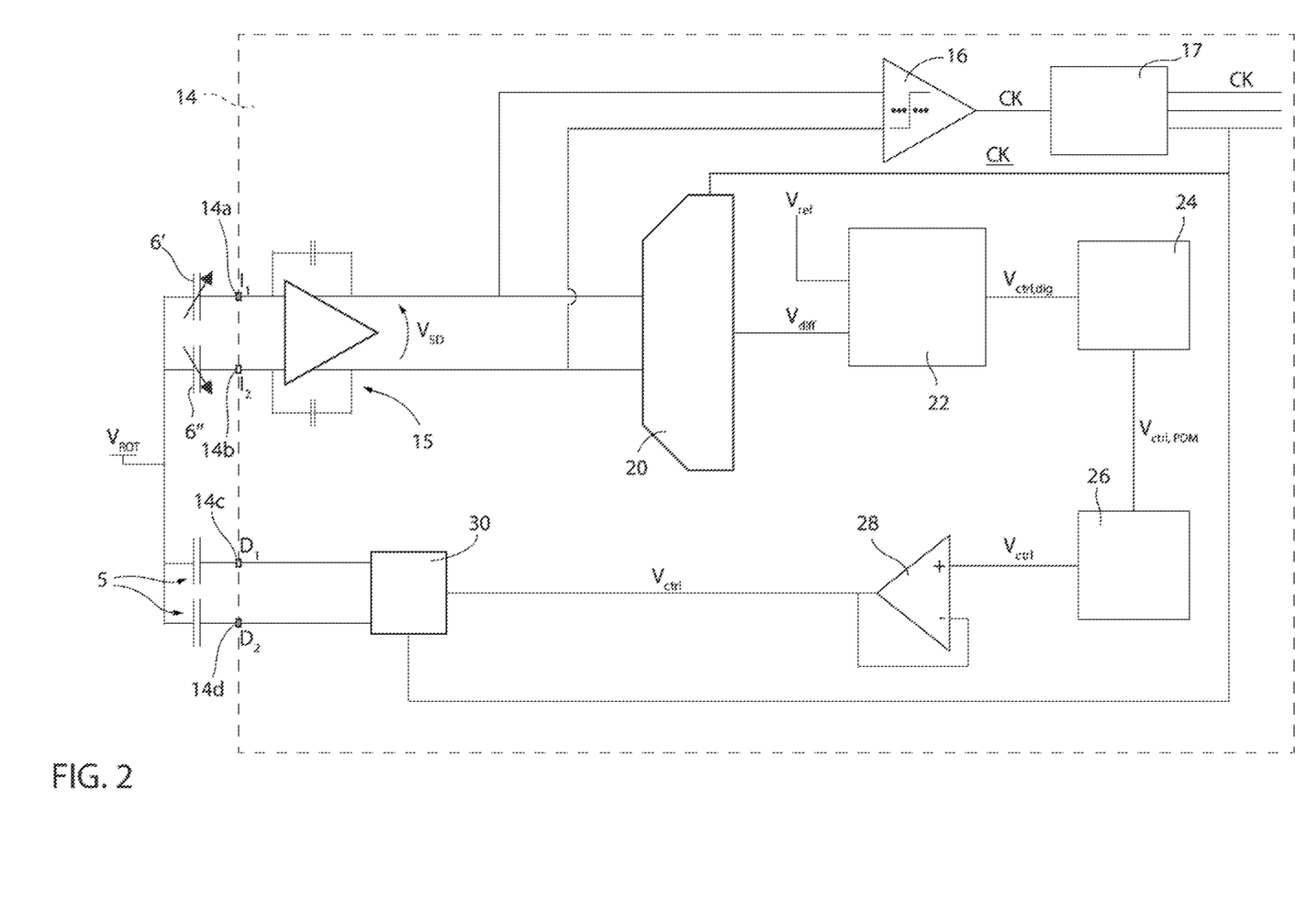
FIG. 2 is a block diagram of a driving circuit of the gyroscope of FIG. 1, according to an embodiment of the present disclosure.

As illustrated in FIG. 2, the driving circuit 14 has: a first input 14a and a second input 14b, configured to receive the sensing signals $I_1$ and $I_2$, respectively; and a first output 14c and a second output 14d, configured to supply the driving signals $D_1$ and $D_2$, respectively. The first input 14a is electrically connected to the first series of first sensing electrodes 6', the second input 14b is electrically connected to the second series of first sensing electrodes 6", and the first and the second outputs 14c and 14d are electrically connected to the driving electrodes 5.

The driving circuit 14 comprises, optionally, an input stage 15 which is coupled to the first and the second inputs 14a and 14b and is configured to generate as an output a differential sensing signal $V_{SD}$, in particular a differential voltage signal, as a function of the sensing signals $I_1$ and $I_2$. The input stage 15 is, for example, a capacitance-to-voltage (C2V) converter configured to generate, as a function of the capacitance variation signals received as inputs by the first sensing electrodes 6, the differential sensing signal $V_{SD}$ which is indicative of the displacement of the seismic mass 2 along the X-axis. However, alternative embodiments may be provided for the input stage 15, which might for example comprise a transimpedance amplifier. In greater detail, the differential sensing signal $V_{SD}$ is a sinusoidal signal at the oscillation frequency $f_{dr}$ of the movable mass 7.

The driving circuit 14 also comprises, optionally: a comparator stage 16, which receives the differential sensing signal $V_{SD}$ as an input and generates as an output (for example, by sensing the zero-crossing) a natural clock signal ck at the oscillation frequency $f_{dr}$; and a PLL stage 17 of known type, which receives the natural clock signal ck as an input and generates as an output a suitable number of derived clock signals ck at frequencies suitably correlated to the oscillation frequency $f_{dr}$, which are used in a known manner in the MEMS gyroscope 1 (for example for the operations performed by the same driving circuit 14 and by the sensing circuit 12).

The driving circuit 14 further comprises a digital conversion stage 20 which is electrically coupled to the input stage 15 and to the PLL stage 17, receives the differential sensing signal $V_{SD}$ and one of the derived clock signals ck as inputs and generates, as a function of the differential sensing signal $V_{SD}$, a digital differential signal $V_{diff}$ of digital type as an output. In particular, the digital conversion stage 20 comprises an analog-to-digital converter (ADC). In detail, the digital conversion stage 20 generates the digital differential signal $V_{diff}$ by sampling and converting the differential sensing signal $V_{SD}$ into digital in a predetermined manner, as a function of the derived clock signal ck received. In greater detail, the digital conversion stage 20 samples the differential sensing signal $V_{SD}$ at values of interest of the latter (e.g., having known and constant phase shifts between each other in the differential sensing signal $V_{SD}$), which form a subset of the overall values of the differential sensing signal $V_{SD}$. Consequently, the digital differential signal $V_{diff}$ is indicative of such values of interest of the differential sensing signal $V_{SD}$. According to an exemplary aspect of the present disclosure, the digital differential signal $V_{diff}$ is obtained by sampling, thanks to the derived clock signal ck, the peaks of the differential sensing signal $V_{SD}$. However, it is possible that the sampling occurs in a different manner and, for example, is performed at the valleys of the differential sensing signal $V_{SD}$.

The driving circuit 14 comprises processing circuitry 22 (which may be referred to herein as a processing block 22) which is electrically coupled to the digital conversion stage 20, receives the digital differential signal $V_{diff}$ and a differential reference signal $V_{ref}$ as inputs and generates, on the basis of the digital differential signal $V_{diff}$, a digital control signal $V_{ctrl,dig}$ as an output. In particular, the digital control signal $V_{ctrl,dig}$ is obtained by comparing the digital differential signal $V_{diff}$ and the differential reference signal $V_{ref}$ to obtain a comparison signal, and amplifying this comparison signal. In greater detail, the comparison signal is indicative of a difference between the digital differential signal $V_{diff}$ and the differential reference signal $V_{ref}$ and is also multiplied by a gain factor (k>1, and for example k=100). In other words, $V_{ctrl,dig}=k\cdot(V_{diff}-V_{ref})$. The differential reference signal $V_{ref}$ is the target signal which generates a biasing of the driving electrodes 5 such that the MEMS gyroscope 1 operates in resonance with a controlled amplitude of oscillation (i.e., such that the movable mass 7 oscillates in resonance). Consequently, the digital control signal $V_{ctrl,dig}$ is indicative of an error in the amplitude of oscillation between the oscillation of the movable mass 7 being measured and the target oscillation which causes the MEMS gyroscope 1 to be in resonance, when it operates at the resonance frequency. For example, although this value is not limiting as it depends on process and design parameters and on the technology used, the differential reference signal $V_{ref}$ may be equal to approximately 1 V.

The driving circuit 14 comprises an analog conversion stage 24 which is electrically coupled to the processing block 22 and which receives the digital control signal $V_{ctrl,dig}$ as an input to convert it into an analog signal.

In particular, the analog conversion stage 24 comprises a digital-to-analog converter (DAC) of ΣΔ-type (hereinafter therefore also called ΣΔ DAC 24) which generates, from the digital control signal $V_{ctrl,dig}$, a PDM control signal $V_{ctrl,PDM}$. For example, the ΣΔ DAC 24 is a 1-bit DAC. In detail, the PDM control signal $V_{ctrl,PDM}$ is modulated through pulse density modulation (PDM) and varies over time between a first voltage ($V_0$, for example equal to 0 V) and a second voltage ($V_{DD}$>0V, for example equal to a voltage supply of the MEMS gyroscope 1). According to an embodiment of the present disclosure, the ΣΔ DAC 24 is of the first order and is made by an accumulator of overflowing type.

The driving circuit 14 comprises a filtering stage 26 of passive type which is electrically coupled to the ΣΔ DAC 24, receives the PDM control signal $V_{ctrl,PDM}$ as an input and filters it, generating a control signal $V_{ctrl}$ as an output. In particular, the filtering stage 26 comprises a low-pass filter configured to remove the high-frequency noise introduced by the ΣΔ DAC 24. The filtering stage 26 is configured to pass substantially only a DC component of the PDM control signal $V_{ctrl,PDM}$ and, in greater detail, performs a low-pass filtering with a cut-off frequency comprised between hundreds of Hz and a few kHz (e.g., between approximately 100 Hz and approximately 5 kHz), and for example equal to approximately 500 Hz.

Furthermore, the driving circuit 14 optionally comprises a buffer 28 (or voltage follower) which has an input electrically coupled to the filtering stage 26, and a low-impedance output (i.e., having a lower impedance than the impedance of the input of the buffer 28). In detail, the buffer 28 receives the control signal $V_{ctrl}$ as an input and transfers it to the output, where the output impedance of the buffer 28 is decoupled with respect to the input impedance of the buffer 28.

The driving circuit 14 further comprises a driving stage 30 of a known type which is electrically coupled to the buffer 28 and to the PLL stage 17. The driving stage 30 has a first and a second output which form the first output 14c and, respectively, the second output 14d of the driving circuit 14. In particular, the driving stage 30 receives a suitable one of the derived clock signals ck from the PLL stage 17, receives the control signal $V_{ctrl}$ from the buffer 28, and generates the driving signals $D_1$ and $D_2$ as outputs, as a function of the control signal $V_{ctrl}$ and in a known manner. In particular, the driving stage 30 implements an H-bridge to control the driving electrodes 5 and, therefore, the movable mass 7.

The driving circuit 14 then implements the feedback control so as to force the value of the driving signals $D_1$ and $D_2$ to values such that the differential sensing signal $V_{SD}$ has a desired relationship with the differential reference signal $V_{ref}$ (so as to obtaining, consequently, the desired amplitude of oscillation of the movable mass 7). In other words, the control signal $V_{ctrl}$ is the feedback with which to control the MEMS gyroscope 1 in such a way that the oscillation of the movable mass 7 being measured matches with the target oscillation (i.e., it is such that the digital differential signal $V_{diff}$ comes to be equal to the differential reference signal $V_{ref}$).

Figure 3A:
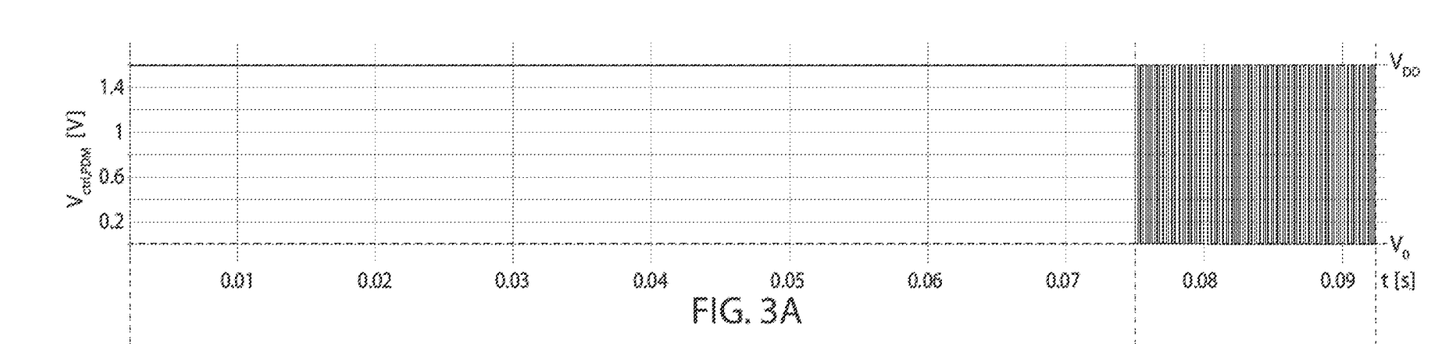
FIGS. 3A-3C show graphs of electrical signals of the driving circuit of FIG. 2, in an initial transient state of the gyroscope of FIG. 1.
Figure 3B:
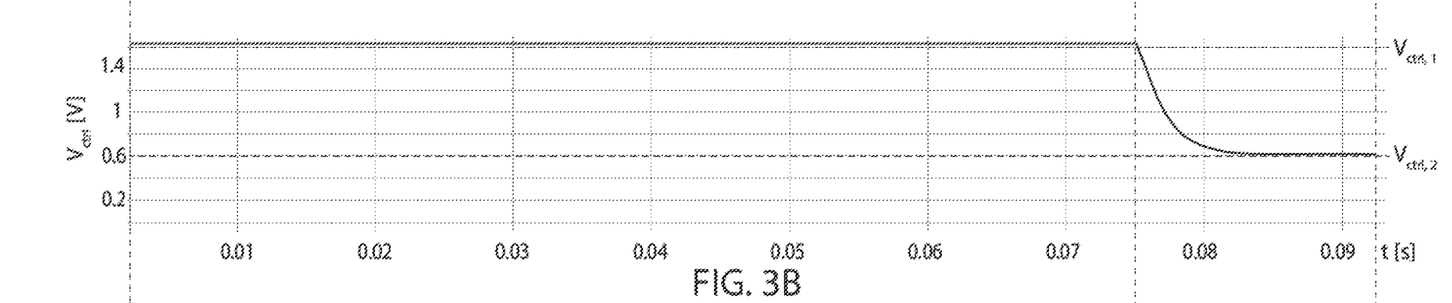
Figure 3C:
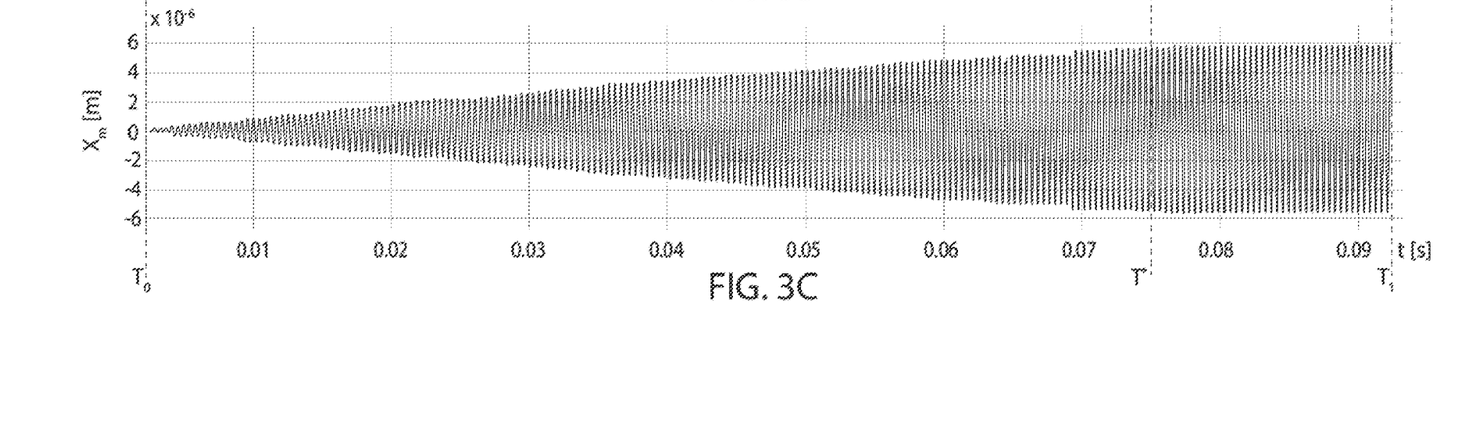

FIGS. 3A-3C show, respectively, the PDM control signal $V_{ctrl,PDM}$ output from the analog conversion stage 24, the control signal $V_{ctrl}$ output from the filtering stage 26, and the resulting sensed displacement of the movable mass 7 (indicated with the reference $X_m$ and considered relative to a rest position of the movable mass 7). These signals are shown, in FIGS. 3A-3C, as a function of the time and in a first time interval (e.g., comprised between an initial time $T_0$ and a first time $T_1 > T_0$) which shows an initial transient state of the MEMS gyroscope 1: at the initial time $T_0$ the MEMS gyroscope 1 is operated (i.e., the movable mass 7 is controlled to switch from a rest condition to an oscillation condition), and at the first time $T_1$ the MEMS gyroscope 1 has reached a steady oscillatory state (i.e., the maximum amplitude of oscillation of the movable mass 7 is substantially constant over time). As noted, the PDM control signal $V_{ctrl,PDM}$ is constant and equal to the second voltage $V_{DD}$ between the initial time $T_0$ and an intermediate time $T^*$ ($T_0 < T^* < T_1$), and oscillates between the first voltage $V_0$ and the second voltage $V_{DD}$ after the intermediate time $T^*$. The control signal $V_{ctrl}$ is constant at a respective first value $V_{ctrl,1}$ between the initial time $T_0$ and the intermediate time $T^*$ and, after the intermediate time $T^*$, it decreases (e.g., in an exponential manner) until it oscillates stably around a second value $V_{ctrl,2}$ ($V_{ctrl,2} < V_{ctrl,1}$) as best shown in FIG. 4B. The movable mass 7 is controlled through the control signal $V_{ctrl}$ to oscillate in resonance, and in particular has a displacement $X_m$ with a maximum amplitude starting from zero (at the initial time $T_0$) and growing until it oscillates stably around a resonance amplitude (after the intermediate time $T^*$, and for example at the first time $T_1$). The resonance amplitude depends, in a known manner, on the design specifications of the MEMS gyroscope 1.

Figure 4A:
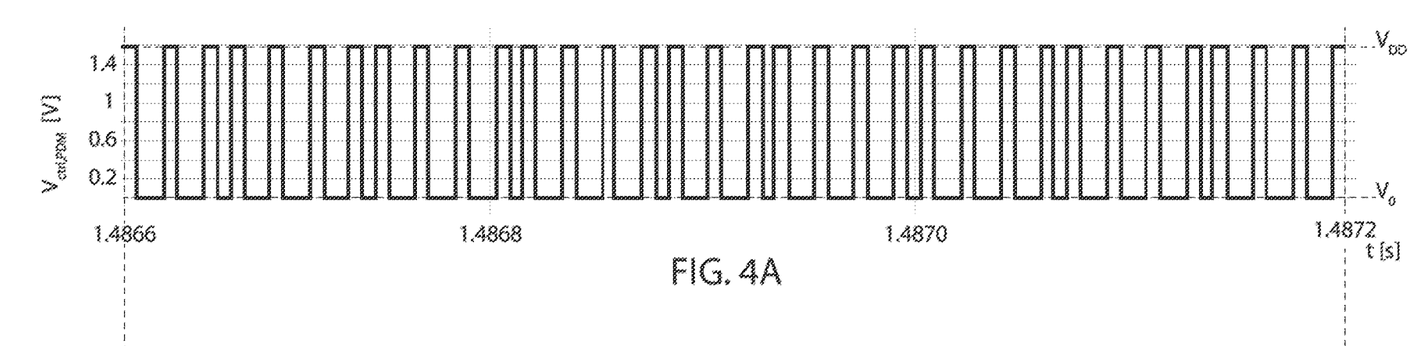
FIGS. 4A-4C show, respectively, graphs of the electrical signals of FIGS. 3A-3C, in a resonance state of the gyroscope of FIG. 1.
Figure 4B:
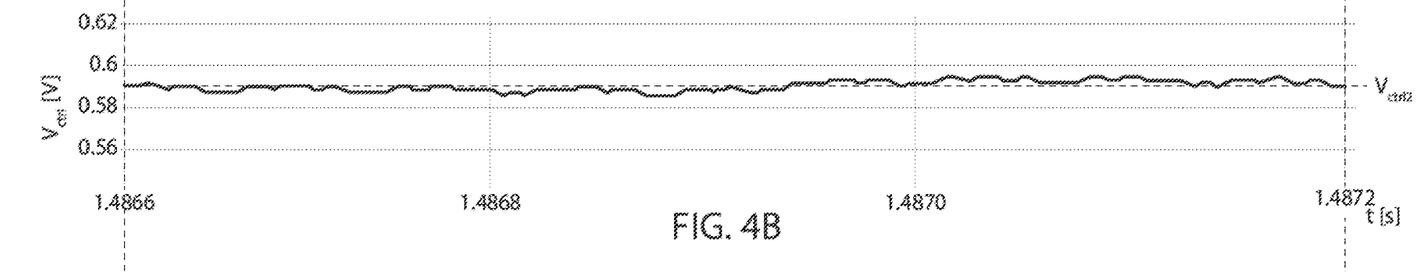
Figure 4C:
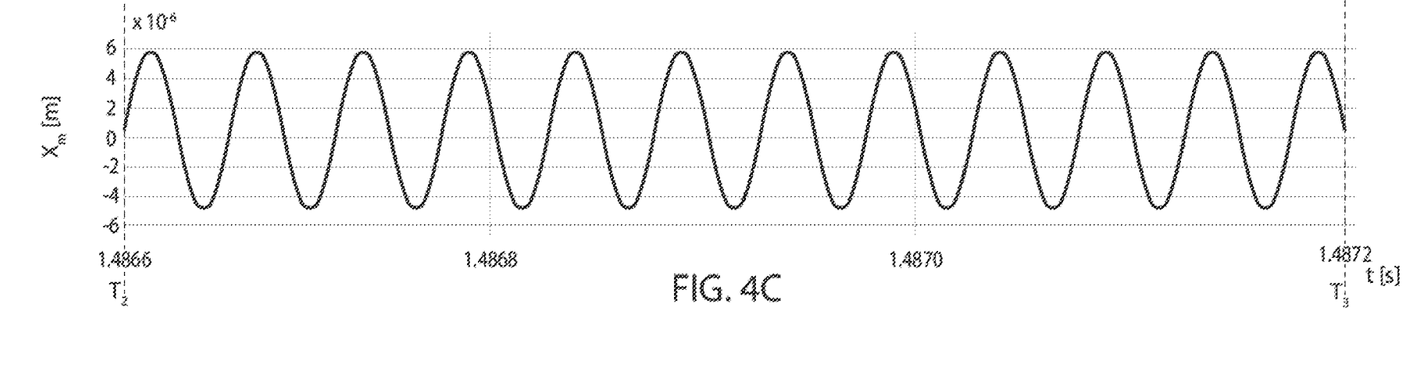

FIGS. 4A-4C show, respectively, the PDM control signal $V_{ctrl,PDM}$, the control signal $V_{ctrl}$ and the resulting displacement $X_m$ of the movable mass 7, when the MEMS gyroscope 1 is in resonance. These signals are shown, in FIGS. 4A-4C, as a function of the time and in a second time interval (e.g., comprised between a second time $T_2$ and a third time $T_3$, with $T^* < T_2 < T_3$ and for example with $T_1 < T_2 < T_3$) which shows the steady resonance state (also called "steady state") of the MEMS gyroscope 1. As noted, the PDM control signal $V_{ctrl,PDM}$ oscillates between the first voltage $V_0$ and the second voltage $V_{DD}$ with a pulse density which is indicative of the error in amplitude of oscillation with which to control the displacement of the movable mass 7. Furthermore, the control signal $V_{ctrl}$ oscillates stably around the second value $V_{ctrl,2}$ (e.g., the variation with respect to the second value $V_{ctrl,2}$ depends on the gain of the loop gain and is generally comprised in a range of approximately ±1% of the second value $V_{ctrl,2}$) so that the displacement $X_m$ of the movable mass 7 has a maximum amplitude which is approximately constant (e.g., dependent on the gain of the loop gain and generally comprised in a range of approximately ±1% of the maximum amplitude).

Furthermore, the MEMS gyroscope 1 may be comprised in an apparatus (not shown and for example a mobile phone, a PC or a wearable device such as a smartwatch), in order to allow the apparatus to sense the angular speed $\Omega_z$ to which it is subject.

From an examination of the characteristics of the disclosure made according to the present disclosure, the advantages that it allows to obtain are apparent.

In particular, the driving circuit 14 allows the MEMS gyroscope 1 to be controlled so as to ensure its oscillation in resonance, and has an analog-type control and digital-type control combination. In detail, the driving circuit 14 implements, through the digital conversion stage 20, the processing block 22, the analog conversion stage 24, the filtering stage 26 and the buffer 28, a control on the amplitude of oscillation of the movable mass 7 in resonance.

The processing block 22 is made by a specific processing unit integrated in the MEMS gyroscope 1 (e.g., a dedicated integrated logic such as a CPU or a dedicated microcontroller), and is not implemented in an FPGA. This allows a reduction in costs, complexity and consumption of the MEMS gyroscope 1.

Furthermore, the use of the ΣΔ DAC as an analog conversion stage 24 ensures a reduction in power consumption with respect to known control circuits. In particular, the use of the first-order ΣΔ DAC minimizes the complexity of the driving circuit 14 and therefore the energy consumption thereof.

The filtering stage 26 reduces the high-frequency quantization noise generated by the PDM-type modulation of the analog conversion stage 24, avoiding the generation of higher and spurious vibrational modes of the MEMS gyroscope 1. Furthermore, the filtering stage 26 is of passive type (this reduces energy consumption with respect to the use in known circuits of active filters).

Furthermore, the sampling performed by the digital conversion stage 20 (in detail, at the peaks of the differential sensing signal $V_{SD}$) is at a frequency being equal to or lower than the oscillation frequency $f_{dr}$, and this further reduces the power consumption of the driving circuit 14.

Finally, it is clear that modifications and variations may be made to the disclosure described and illustrated herein without thereby departing from the scope of the present disclosure, as defined in the attached claims.

In particular, the structure of the MEMS gyroscope 1 described with reference to FIG. 1 is purely exemplary and other known structures may be similarly considered. For example, the MEMS gyroscope may be of multiaxial type. Furthermore, the MEMS gyroscope may be replaced by any second-order MEMS oscillator.

A driving circuit (14) for controlling a MEMS oscillator (1), may be summarized as including a digital conversion stage (20) configured to acquire a differential sensing signal ($V_{SD}$) indicative of a sensed displacement of a movable mass (7) of the MEMS oscillator (1), and to convert the differential sensing signal ($V_{SD}$) of analog type into a digital differential signal ($V_{diff}$) of digital type; a processing block (22) electrically coupled to the digital conversion stage (20) and configured to generate a digital control signal ($V_{ctrl,dig}$) of digital type as a function of the comparison between the digital differential signal ($V_{diff}$) and a differential reference signal ($V_{ref}$) indicative of a target amplitude of oscillation of the movable mass (7) which causes, at the resonance frequency of the MEMS oscillator (1), the resonance of the MEMS oscillator (1); an analog conversion stage (24) electrically coupled to the processing block (22) and configured to convert the digital control signal ($V_{ctrl,dig}$) into a PDM control signal ($V_{ctrl,PDM}$) of analog type, the analog conversion stage (24) including a digital-to-analog converter, DAC, of $\Sigma\Delta$ type; and a filtering stage (26) of low-pass type electrically coupled to the analog conversion stage (24) and configured to, by filtering the PDM control signal ($V_{ctrl,PDM}$), generate a control signal ($V_{ctrl}$) for controlling the amplitude of oscillation of the movable mass (7).

The digital conversion stage (20) may be configured to sample the differential sensing signal ($V_{SD}$) at values of interest of the differential sensing signal ($V_{SD}$).

The values of interest may be peaks of the differential sensing signal ($V_{SD}$).

The driving circuit (14) may further include a buffer (28) having an output and an input electrically coupled to the filtering stage (26), wherein the buffer (28) may be configured to receive the control signal ($V_{ctrl}$) as an input and to transfer the control signal ($V_{ctrl}$) as an output, and an output impedance of the buffer (28) may be less than an input impedance of the buffer (28).

The driving circuit (14) may further include a comparator stage (16) configured to receive the differential sensing signal ($V_{SD}$) as an input and to generate as an output a natural clock signal (ck) with an oscillation frequency ($f_{dr}$); and a PLL stage (17) electrically coupled to the comparator stage (16) and configured to receive the natural clock signal (ck) as an input and to generate as outputs one or more derived clock signals ($\underline{ck}$) at respective frequencies correlated to the oscillation frequency ($f_{dr}$).

The driving circuit (14) may further include a driving stage (30) which may be electrically coupled to the filtering stage (26) and to the PLL stage (17), may be configured to receive, from the PLL stage (17), one of the one or more derived clock signals (ck), may be configured to receive the control signal ($V_{ctrl}$), and may be configured to generate, as a function of the control signal ($V_{ctrl}$), one or more driving signals ($D_1$, $D_2$) for controlling the oscillation of the movable mass (7).

The $\Sigma\Delta$ DAC may be of first order.

Th4e $\Sigma\Delta$ DAC may be a 1 bit-DAC and the PDM control signal ($V_{ctrl,PDM}$) may oscillate over time between a first voltage ($V_0$) and a second voltage ($V_{DD}$).

The digital control signal ($V_{ctrl,dig}$) may be a function of a gain factor and of a difference between the digital differential signal ($V_{diff}$) and the differential reference signal ($V_{ref}$).

The filtering stage (26) may be of passive type.

The filtering stage (26) may be configured to operate a filtering at a cut-off frequency included between 100 Hz and 5 kHz.

The driving circuit (14) may further include an input stage (15) which may be electrically coupled to the digital conversion stage (20), may be configured to acquire one or more sensing signals ($I_1$, $I_2$) indicative of respective capacitive variations caused by the displacement of the movable mass (7) of the MEMS oscillator (1), and may be configured to generate as an output the differential sensing signal ($V_{SD}$) as a function of the one or more sensing signals ($I_1$, $I_2$), the differential sensing signal ($V_{SD}$) being a voltage signal.

A MEMS oscillator (1) may be summarized as including a substrate (S); a driving circuit (14), according to any of claims 1-12, integrated in the substrate (S); and said movable mass (7) elastically coupled to the substrate (S) and controllable through the control signal ($V_{ctrl}$) to oscillate in resonance with respect to the substrate (S).

The MEMS oscillator (1) may be a MEMS gyroscope.

An apparatus may be summarized as including a MEMS oscillator (1).

A method of controlling a MEMS oscillator (1), may be summarized as including the steps of acquiring, through a digital conversion stage (20), a differential sensing signal ($V_{SD}$) indicative of a sensed displacement of a movable mass (7) of the MEMS oscillator (1), converting, through a digital conversion stage (20), the differential sensing signal ($V_{SD}$) of analog type into a digital differential signal ($V_{diff}$) of digital type; generating, through a processing block (22) electrically coupled to the digital conversion stage (20), a digital control signal ($V_{ctrl,dig}$) of digital type as a function of the comparison between the digital differential signal ($V_{diff}$) and a differential reference signal ($V_{ref}$) indicative of a target amplitude of oscillation of the movable mass (7) which causes, at the resonance frequency of the MEMS oscillator (1), the resonance of the MEMS oscillator (1); converting, through an analog conversion stage (24) electrically coupled to the processing block (22), the digital control signal ($V_{ctrl,dig}$) into a PDM control signal ($V_{ctrl,PDM}$) of analog type, the analog conversion stage (24) including a digital-to-analog converter, DAC, of $\Sigma\Delta$ type; generating, through a filtering stage (26) of low-pass type electrically coupled to the analog conversion stage (24), a control signal ($V_{ctrl}$) by filtering the PDM control signal ($V_{ctrl,PDM}$); and controlling the amplitude of oscillation of the movable mass (7) through the control signal ($V_{ctrl}$).

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A driving circuit for controlling a MEMS oscillator, comprising:
a digital conversion stage configured to acquire a differential sensing signal indicative of a sensed displacement of a movable mass of the MEMS oscillator, and to convert the differential sensing signal of analog type into a digital differential signal of digital type;
processing circuitry electrically coupled to the digital conversion stage and configured to generate a digital control signal of digital type as a function of the comparison between the digital differential signal and a differential reference signal indicative of a target amplitude of oscillation of the movable mass which causes, at the resonance frequency of the MEMS oscillator, the resonance of the MEMS oscillator;

an analog conversion stage electrically coupled to the processing circuitry and configured to convert the digital control signal into a PDM control signal of analog type, the analog conversion stage including a digital-to-analog converter (DAC) of ΣΔ type; and a filtering stage of low-pass type electrically coupled to the analog conversion stage and configured to, by filtering the PDM control signal, generate a control signal for controlling the amplitude of oscillation of the movable mass.

2. The driving circuit according to claim 1, wherein the digital conversion stage is configured to sample the differential sensing signal at values of interest of the differential sensing signal.

3. The driving circuit according to claim 2, wherein the values of interest are peaks of the differential sensing signal.

4. The driving circuit according to claim 1, further comprising a buffer having an output and an input electrically coupled to the filtering stage, wherein the buffer is configured to receive the control signal as an input and to transfer the control signal as an output, and wherein an output impedance of the buffer is less than an input impedance of the buffer.

5. The driving circuit according to claim 1, further comprising:
a comparator stage configured to receive the differential sensing signal as an input and to generate as an output a natural clock signal with an oscillation frequency; and
a PLL stage electrically coupled to the comparator stage and configured to receive the natural clock signal as an input and to generate as outputs one or more derived clock signals at respective frequencies correlated to the oscillation frequency.

6. The driving circuit according to claim 5, further comprising a driving stage electrically coupled to the filtering stage and to the PLL stage, the driving stage configured to:
receive, from the PLL stage, one of the one or more derived clock signals,
receive the control signal, and
generate, as a function of the control signal, one or more driving signals for controlling the oscillation of the movable mass.

7. The driving circuit according to claim 1, wherein the ΣΔ DAC is of first order.

8. The driving circuit according to claim 1, wherein the ΣΔ DAC is a 1 bit-DAC and the PDM control signal oscillates over time between a first voltage and a second voltage.

9. The driving circuit according to claim 1, wherein the digital control signal is a function of a gain factor and of a difference between the digital differential signal and the differential reference signal.

10. The driving circuit according to claim 1, wherein the filtering stage is of passive type.

11. The driving circuit according to claim 1, wherein the filtering stage is configured to operate a filtering at a cut-off frequency between 100 Hz and 5 kHz.

12. The driving circuit according to claim 1, further comprising an input stage electrically coupled to the digital conversion stage, the input stage configured to:
acquire one or more sensing signals indicative of respective capacitive variations caused by the displacement of the movable mass of the MEMS oscillator, and generate as an output the differential sensing signal as a function of the one or more sensing signals, the differential sensing signal being a voltage signal.

13. A MEMS oscillator comprising:
a substrate;
a movable mass; and
a driving circuit integrated in the substrate, the driving circuit including:
a digital conversion stage configured to acquire a differential sensing signal indicative of a sensed displacement of the movable mass, and to convert the differential sensing signal of analog type into a digital differential signal of digital type;
processing circuitry electrically coupled to the digital conversion stage and configured to generate a digital control signal of digital type as a function of the comparison between the digital differential signal and a differential reference signal indicative of a target amplitude of oscillation of the movable mass which causes, at the resonance frequency of the MEMS oscillator, the resonance of the MEMS oscillator;
an analog conversion stage electrically coupled to the processing block and configured to convert the digital control signal into a PDM control signal of analog type, the analog conversion stage including a digital-to-analog converter (DAC) of ΣΔ type; and
a filtering stage of low-pass type electrically coupled to the analog conversion stage and configured to, by filtering the PDM control signal, generate a control signal for controlling the amplitude of oscillation of the movable mass,
wherein the movable mass is elastically coupled to the substrate and controllable through the control signal to oscillate in resonance with respect to the substrate.

14. The MEMS oscillator according to claim 13, wherein the MEMS oscillator is a MEMS gyroscope.

15. The MEMS oscillator according to claim 13, wherein the digital conversion stage is configured to sample the differential sensing signal at values of interest of the differential sensing signal.

16. The MEMS oscillator according to claim 15, wherein the values of interest are peaks of the differential sensing signal.

17. The MEMS oscillator according to claim 13, further comprising a buffer having an output and an input electrically coupled to the filtering stage, wherein the buffer is configured to receive the control signal as an input and to transfer the control signal as an output, and wherein an output impedance of the buffer is less than an input impedance of the buffer.

18. The MEMS oscillator according to claim 13, further comprising:
a comparator stage configured to receive the differential sensing signal as an input and to generate as an output a natural clock signal with an oscillation frequency; and
a PLL stage electrically coupled to the comparator stage and configured to receive the natural clock signal as an input and to generate as outputs one or more derived clock signals at respective frequencies correlated to the oscillation frequency.

19. A method of controlling a MEMS oscillator, comprising:
acquiring, through a digital conversion stage, a differential sensing signal indicative of a sensed displacement of a movable mass of the MEMS oscillator;

converting, through a digital conversion stage, the differential sensing signal of analog type into a digital differential signal of digital type;

generating, through processing circuitry electrically coupled to the digital conversion stage, a digital control signal of digital type as a function of the comparison between the digital differential signal and a differential reference signal indicative of a target amplitude of oscillation of the movable mass which causes, at the resonance frequency of the MEMS oscillator, the resonance of the MEMS oscillator;

converting, through an analog conversion stage electrically coupled to the processing circuitry, the digital control signal into a PDM control signal of analog type, the analog conversion stage including a digital-to-analog converter (DAC) of $\Sigma\Delta$ type;

generating, through a filtering stage of low-pass type electrically coupled to the analog conversion stage, a control signal by filtering the PDM control signal; and controlling the amplitude of oscillation of the movable mass through the control signal.

20. The method according to claim 19, further comprising:

sampling the differential sensing signal at values of interest of the differential sensing signal.

* * * * *